(12) United States Patent
Jourdan et al.

(10) Patent No.: US 10,917,026 B2
(45) Date of Patent: Feb. 9, 2021

(54) MICROELECTROMECHANICAL AND/OR NANOELECTROMECHANICAL STRUCTURE WITH ELECTROTHERMAL ACTUATION COMPRISING AT LEAST TWO DIFFERENTLY POLARISABLE ACTUATING BEAMS

(71) Applicants: Commissariat A L'Energie Atomique et aux Energies Alternatives, Paris (FR); SAFRAN ELECTRONICS & DEFENSE, Boulogne Billancourt (FR)

(72) Inventors: Guillaume Jourdan, Grenoble (FR); Guillaume Lehee, Boulogne Billancourt (FR)

(73) Assignees: Commissariat A L'Energie Atomique et aux Energies Alternatives, Paris (FR); SAFRAN ELECTRONICS & DEFENSE, Boulogne Billancourt (FR)

( * ) Notice: Subject to any disclaimer, the term of this patent is extended or adjusted under 35 U.S.C. 154(b) by 585 days.

(21) Appl. No.: 15/297,243

(22) Filed: Oct. 19, 2016

(65) Prior Publication Data

US 2017/0117825 A1 Apr. 27, 2017

(30) Foreign Application Priority Data

Oct. 21, 2015 (FR) .................................... 15 60045

(51) Int. Cl.
*H02N 10/00* (2006.01)
*B81B 3/00* (2006.01)

(52) U.S. Cl.
CPC ........... *H02N 10/00* (2013.01); *B81B 3/0024* (2013.01); *B81B 2201/031* (2013.01)

(58) Field of Classification Search
CPC ................................................ H01H 59/0009

(Continued)

(56) References Cited

U.S. PATENT DOCUMENTS 5,796,152 A * 8/1998 Carr ...................... H01H 1/0036
257/415
6,675,578 B1 * 1/2004 Sinclair ................. B81B 3/0051
310/307

(Continued)

FOREIGN PATENT DOCUMENTS

EP 2 322 971 A2 5/2011
EP 2 711 696 A1 3/2014

OTHER PUBLICATIONS

French Preliminary Search Report dated Jul. 11, 2016 in French Application 15 60045, filed on Oct. 21, 2015 ( with English Translation of categories of Cited Documents).

(Continued)

*Primary Examiner* — Alexander Talpalatski
(74) *Attorney, Agent, or Firm* — Oblon, McClelland, Maier & Neustadt, L.L.P.

(57) ABSTRACT

A microelectromechanical structure with electrothermal actuation including a fixed part, a moveable part, a first electrothermal actuating beam enabling an electric current to flow from the fixed part to the moveable part and a second electrothermal actuating beam enabling an electric current to flow from the fixed part to the moveable part, the beams being mechanically connected to the moveable part enabling a displacement of the moveable part by electrothermal actuation, an electrically conductive connecting element connecting the moveable part to the fixed part, a first connector for connecting the first actuating beam to a first polarisation source and a second connector for connecting the second actuating beam to a second polarisation source, such that the first and the second can be polarised differently and separately.

25 Claims, 8 Drawing Sheets

(58) Field of Classification Search
USPC .......................................................... 335/78
See application file for complete search history.

(56) References Cited

U.S. PATENT DOCUMENTS

| | | | |
|---|---|---|---|
| 6,784,771 B1* | 8/2004 | Fan ...................... | B81B 3/0062 335/78 |
| 7,142,077 B2* | 11/2006 | Baeck .................... | H02N 1/008 335/78 |
| 7,948,337 B2* | 5/2011 | Chu ..................... | G11B 9/1481 335/78 |
| 2005/0099665 A1* | 5/2005 | Lee .................... | G02B 26/0841 359/198.1 |
| 2007/0176715 A1* | 8/2007 | Nakanishi .......... | H01H 59/0009 335/78 |
| 2015/0047078 A1 | 2/2015 | Sarkar et al. | |

OTHER PUBLICATIONS

U.S. Appl. No. 14/030,205, filed Sep. 18, 2013, 2014/0076024 A1, Laurent Duraffourg et al.
U.S. Appl. No. 14/260,539, filed Apr. 24, 2014, 2014/0318906 A1, Yannick Deimerly et al.
U.S. Appl. No. 14/364,348, filed Jun. 11, 2014, 2014/0331770 A1, Guillaume Jourdan et al.
U.S. Appl. No. 14/519,390, filed Oct. 21, 2014, 2015/0107357 A1, Sebastien Hentz et al.
U.S. Appl. No. 14/661,430, filed Mar. 18, 2015, 2015/0268115 A1, Philippe Robert et al.
U.S. Appl. No. 15/248,756, filed Aug. 26, 2016, Patrice Rey et al.
Kuan-Hsien Li et al. "A Self-sustained Nanomechanical Thermal-piezoresistive Oscillator with Ultra-Low Power Consumption", IEDM 2014, 2014, 4 pages.
Xiaobo Guo et al. "Gas Sensing Using Thermally Actuated Dual Plate Resonators and Self-Sustained Oscillators", 2012 IEEE, 2012, 5 pages.
Amir Rahafrooz et al. "Thermal-Piezoresistive Energy Pumps in Micromechanical Resonant Structures", IEEE Transactions on Electron Devices, vol. 59, No. 12, 2012, 7 pages.

* cited by examiner

MICROELECTROMECHANICAL AND/OR NANOELECTROMECHANICAL STRUCTURE WITH ELECTROTHERMAL ACTUATION COMPRISING AT LEAST TWO DIFFERENTLY POLARISABLE ACTUATING BEAMS

TECHNICAL FIELD AND STATE OF THE PRIOR ART

The present invention relates to a microelectromechanical and/or nanoelectromechanical structure with electrothermal actuation comprising at least two differently polarisable actuating beams, for example to produce an actuator or a sensor.

Microelectromechanical systems (MEMS) and/or nanoelectromechanical systems (NEMS) comprise a fixed part and at least one moveable part and actuating means for making the moveable part move with respect to the fixed part.

The actuating device may be of different types.

The actuating device may be of electrostatic type, comprising actuating electrodes, for example in the form of capacitive combs or facing electrodes, which occupy a considerable space and which may be of sizes comparable to those of the MEMS or the NEMS. Moreover, the intensity of the capacitive force decreases sharply when the dimensions of the MEMS or the NEMS are reduced. In addition, electrostatic actuation necessitates inter-electrode spaces less than several µm in order to be able to generate sufficiently high forces. These inter-electrode spaces often constitute one of the main sources of energy dissipation in MEMS and NEMS, which is due to the phenomenon called squeeze film damping, even under vacuum (up to 0.001-0.1 mbar).

The actuating device may be of piezoelectric type, using a stack of piezoelectric materials. On the one hand the device is relatively bulky vis-à-vis the MEMS or NEMS structure to actuate. On the other hand, the method for producing the stack of piezoelectric materials may be complex.

The actuating device may be of magnetic type comprising a permanent magnet. It may also have problems of bulk. In addition, the efficiency of this device decreases sharply with the size of the MEMS or the NEMS.

An actuating device of electrothermal type also exists. Electrothermal actuation uses the thermoelastic properties of solids to make MEMS structures move. In fact, when an electrical conductor is electrically polarised, this dissipates energy by Joule effect, which brings about a heating of the conductor which expands on account of the thermoelastic properties of the material that constitutes the MEMS or NEMS structure.

The document Rahafrooz A, Pourkamali S. *Thermal-Piezoresistive Energy Pumps in Micromechanical Resonant Structures. IEEE Trans Electron Devices.* 2012 December; 59(12):3587-93 describes a resonating structure comprising two suspended elements connected by two parallel actuating beams, the two actuating beams each being suspended from the substrate by means of a built-in lateral beam. The polarisation of the two actuating beams via the two built-in beams enables heating of the actuating beams and the generation of an electrothermal actuation. The beams expand, the two suspended elements are then made to move with respect to each other. By applying a sinusoidal polarisation, the suspended elements are made to vibrate. A high frequency resonator may be produced. The polarisation current flows in a lateral beam, in the two actuating beams and in the other lateral beam. The two actuating beams are thus activated by the same current, experience the same heating which generates the same electrothermal forces in phase.

The document Xiabobo Guo, Yun-bo Yi, Rahafrooz A, Pourkamali, *Gas Sensing using thermally actuated dual plate resonators and self-sustained oscillators. Frequency Control Symposium (FCS),* 2012 *IEEE International.* 2012. p. 1-5 describes a system sensitive to the surrounding gas comprising two suspended elements connected by two parallel actuating beams. Each suspended element is attached to the substrate by two beams loaded in bending.

A structure comprising two actuating beams arranged on either side of the moveable part to be displaced cannot be produced. In fact, the polarisation current would flow in an actuating beam, in the moveable part and in the other actuating beam. The electrothermal forces thereby generated would be opposed to each other. Strong constraints thus apply to the shape of structures with electrothermal actuation of the prior art.

DESCRIPTION OF THE INVENTION

It is consequently an aim of the present invention to offer a MEMS and/or NEMS structure with electrothermal actuation comprising at least two actuating beams enabling considerable freedom in the arrangement of the actuating beams, notably making it possible to have actuating beams arranged on either side of the moveable part without the electrothermal forces generated in the beams being opposed to each other.

The aforementioned aim is attained by a MEMS and/or NEMS structure with electrothermal actuation comprising a fixed part, at least one moveable part relative to the fixed part, at least two actuating beams connected to the moveable part and to the fixed part and at least one electrical connecting element between the moveable part and the fixed part, and means making it possible to polarise differently each actuating beam, and thus to generate different strains. The connecting element between the moveable part and the fixed part allows the actuating beams to be traversed by two different currents, each current flowing from the fixed part through an actuating beam and then through the connecting element.

In other words, a third electrical conductor is provided in addition to the two actuating beams making it possible to produce two electrical circuits that can be polarised separately, each electrical circuit including an actuating beam.

Thanks to the invention, it is possible to produce structures in which the two actuating beams are situated on either side of the moveable part and for which the actuating forces generated are constructive.

The actuating beams may be arranged such that they displace the moveable part in translation and/or in rotation.

In a very advantageous manner, the actuating beams are polarised in such a way that thermal fluxes from the actuating beams to the moveable part are compensated.

In a very advantageous manner, the actuating beams have at least one transversal dimension less than or equal to 500 nm, at such dimensions the heating of the beams is greater on account of an increase in the thermal resistivity of the material with respect to the value of the material in volume. The actuating forces generated by this self-heating are thus amplified.

The connecting element may advantageously have a configuration and/or an arrangement with respect to the actuating beam, such that the force generated by electrothermal effect in the connecting element does not oppose and/or does not decrease the action of the actuating beams.

In a very advantageous manner, the thicknesses of the actuating beams are chosen less than that of the moveable part and that of the connecting element, preferably less than or equal to half of the thickness of the moveable part and the thickness of the connecting element. Such a structure offers good energy efficiency. In fact, the result of this difference in thickness between the actuating beams and those of the moveable part and the connecting element is that the electrical resistance of the beams is very high with respect to that of the moveable part and that of the connecting element, and that the current density is concentrated in the actuating beams. Losses by Joule effect are thus concentrated in the beams and the rise in temperature is favoured in the actuating beams. The current delivered for the actuation may be reduced, which makes the MEMS and/or NEMS structure compatible with portable and/or general public systems.

The subject-matter of the present invention is then a microelectromechanical and/or nanoelectromechanical structure with electrothermal actuation comprising a fixed part, at least one moveable part with respect to the fixed part, at least one first electrothermal actuating beam enabling an electrical current to flow from the fixed part to the moveable part and at least one second electrothermal actuating beam enabling an electrical current to flow from the fixed part to the moveable part, said first and second actuating beams being connected at least mechanically to the moveable part and intended to displace the moveable part with respect to the fixed part by electrothermal actuation, at least one electrically conducting connecting element connecting the moveable part to the fixed part, first means of connecting the first actuating beam to a first polarisation source and second means of connecting the second actuating beam to a second polarisation source, such that the first and the second can be polarised differently and separately.

Preferably, the electrothermal actuating beams comprise one or more thermoelastic materials capable of deforming under the effect of thermal heating induced by Joule effect by the electric current intended to flow in said beams. The material(s) is or are selected from among silicon, SiC, SiN for example.

In an example of embodiment, the first and the second actuating beams are aligned and arranged on either side of the moveable part.

The connecting element advantageously has a shape such that an electrothermal force generated within it does not oppose or opposes little the electrothermal force generated in the actuating beams. For example, the connecting element has a crenelated spring shape. In a variant, the connecting element could be for example in the shape of a double spiral spring, chevrons, etc.

In an example of embodiment, the structure comprises two connecting elements aligned along an axis perpendicular to an axis with which the first and second actuating beams are parallel.

In a very advantageous manner, the first and/or the second actuating beam is or are in the form of nanowire. The very small dimensions of the nanowire make it possible to improve the thermal resistivity of the material in which said nanowire is formed and thus make it possible to increase the thermal heating of the material of the nanowire for a given electrical power. The thickness and/or the width of the nanowires is or are less than or equal to 500 nm.

In an advantageous example, the structure comprises at least one first set of several first electrothermal actuating beams capable of applying simultaneously an electrothermal force of same sense to the moveable part and/or a second set of several second electrothermal actuating beams, the first set and/or the second set being connected respectively to the first and to the second polarisation source. When the actuating beams are nanowires, the thermal conductivity of the nanowires is reduced and self-heating is improved.

In another example of embodiment, the structure comprises a pivot articulation between the fixed part and the moveable part and in which the first and second actuating beams are arranged with respect to the moveable part so as to cause its rotation with respect to the fixed part, said rotation being in the plane of the structure or out-of-plane.

For example, the pivot articulation comprises two aligned connecting elements defining the axis of rotation, said connecting elements being torsionally deformable and the first and second actuating beams are connected mechanically to the moveable part such that the electrothermal forces generated in the actuating beams cause the out-of-plane rotation of the moveable part. In another example, the rotational articulation comprises two connecting elements of which the axes are secant.

In another example of embodiment, the moveable part is mechanically connected to the fixed part by an anchoring, said anchoring forming a connecting element and in which the first and second actuating beams are oriented with respect to the moveable part to cause its elastic deformation.

Advantageously, the pivot articulation is such that it also enables a translational displacement and the first and second actuating beams are connected to a same side of the moveable part on either side of the articulation.

The structure may comprise two first actuating beams and two second actuating beams.

The actuating beams preferably have thicknesses less than or equal to half of a thickness of the moveable part and less than or equal to half of a thickness of the connecting element.

Also preferably, the actuating beams have aspect ratios comprised between 1 and 2.

The structure may comprise means of detecting a displacement of the moveable part. The detection means may be piezoresistive means. In a variant, the detection means could also be for example piezoelectric means.

Advantageously, the detection means are formed by at least one of the actuating beams.

Another subject matter of the present invention is also a system comprising at least one structure according to the invention, a first polarisation source and a second polarisation source.

In an example, the first and second polarisation sources are of direct type and have different amplitudes. In another example, first and second polarisation sources are of alternating type and are in quadrature.

Another subject matter of the present invention is also an actuator comprising at least one system according to the invention.

Another subject matter of the present invention is also a sensor comprising at least one system according to the invention.

Another subject matter of the present invention is also a method for commanding a system according to the invention, in which the first and second actuating beams are polarised with different amplitudes or in which the first and second actuating beams are polarised in quadrature.

The method for commanding may also comprise the steps of:
heating the moveable part to a given temperature,
modulating an amplitude and/or a phase of the polarisations of the first and second polarisation sources such that the thermal flux on the first actuating beam tends to increase the given temperature and the thermal flux of the second actuating beam tends to reduce the given temperature and such that the temperature of the moveable part is substantially constant.

BRIEF DESCRIPTION OF THE DRAWINGS

The present invention will be better understood on the basis of the description that follows and from the appended drawings in which.

The representations of structures are not to scale, the proportions between the different elements of the structures not necessarily being respected.

DETAILED DESCRIPTION OF PARTICULAR EMBODIMENTS

The description that follows describes MEMS and/or NEMS structures with electrothermal actuation, these structures being able to be implemented in a large number of applications, such as actuators for displacing a mirror or a switch and sensors.

In the present application, "moveable part" is taken to mean a part of a MEMS and/or NEMS structure capable of being displaced at least partially with respect to a fixed part of the MEMS and/or NEMS structure in the plane of the structure or out-of-plane of the structure. Displacement "at least partially" is taken to mean a part that could for example be anchored by one end on the fixed part and of which another end could be deformed mechanically and in an elastic manner.

Figure 1:
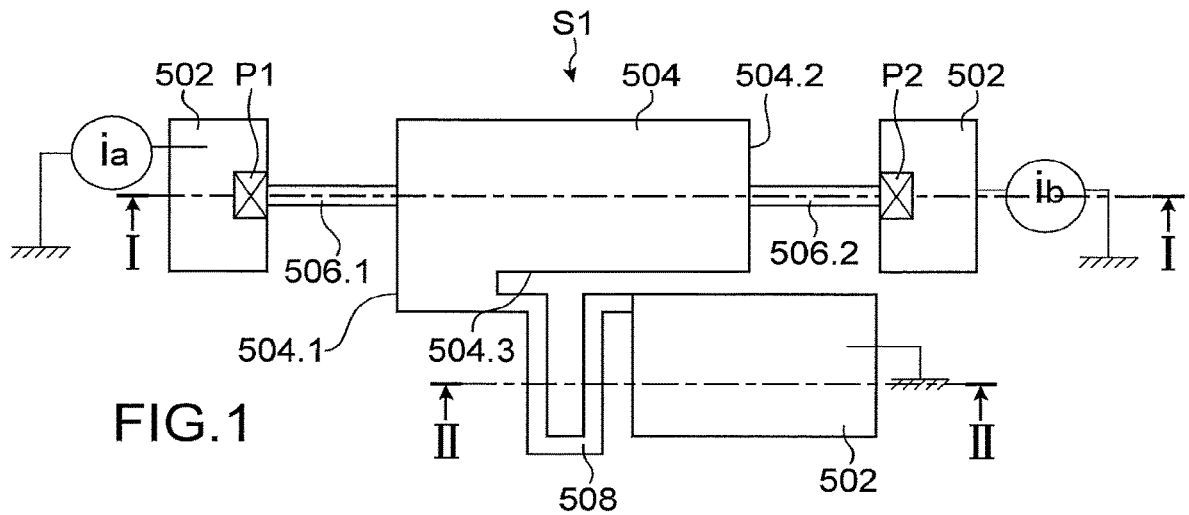
FIG. 1 is a top view of an example of embodiment of a MEMS and/or NEMS structure according to the invention comprising two actuating beams each activated by a different current source.
Figure 2A:
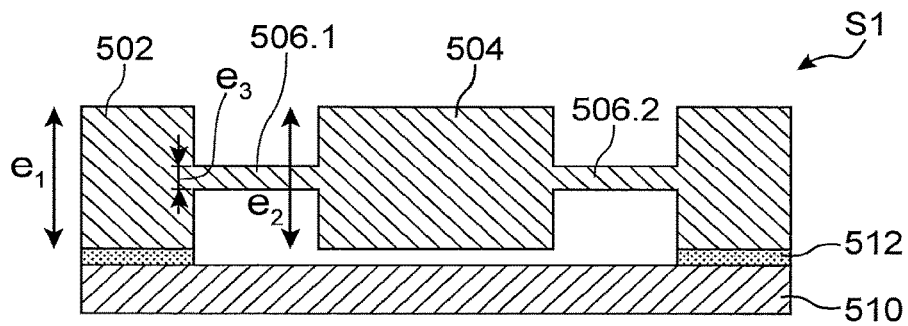
FIGS. 2A and 2B are sectional views along the planes I-I and II-II respectively of the structure of FIG. 1.
Figure 2B:
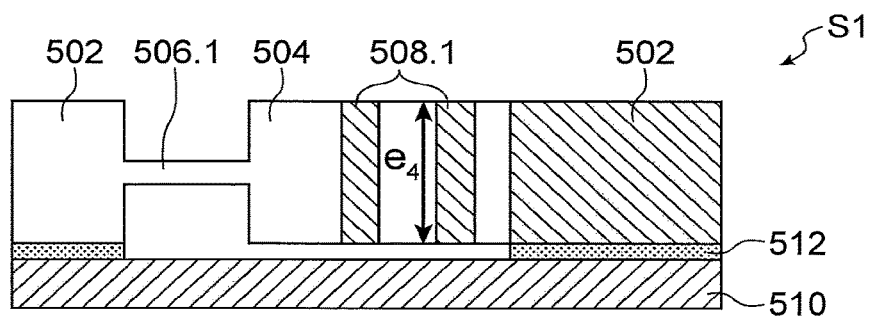

In FIGS. 1, 2A and 2B may be seen an example of embodiment of a structure S1.

The structure S1 comprises a fixed part 502, a moveable part 504, a first actuating beam 506.1 extending between the fixed part and an edge 504.1 of the moveable part 504, two actuating beams 506.1, 506.2 extending between the fixed part and the moveable part. The beam 506.1 extends between the fixed part and an edge 504.1 of the moveable part 504 and the beam 506.2 extends between the fixed part and an edge 504.2 of the moveable part 504 opposite to the edge 504.1, and at least one connecting element 508 between the moveable part 504 and the fixed part 502. The connecting element 508 in the example represented extends onto an edge 504.3 of the moveable part perpendicular to the edges 504.1 and 504.2. It further advantageously has a crenelated spring shape. It has a certain flexibility in the direction of the X axis. Moreover this shape advantageously makes it possible to reduce the electrothermal force appearing in the connecting element and which will be described below.

In the example represented, the two actuating beams are aligned along the direction X of displacement in the plane of the moveable part.

In the example represented in FIG. 2A, the actuating beam 506 is situated substantially in the median plane of the moveable part 504. This arrangement is not limiting. In a variant, the actuating beams 506.1, 506.2 could be situated below the median plane in the moveable part 504. According to another variant, the actuating beams 506.1, 506.2 could be situated above the median plane, their upper faces being in the plane of the upper face of the moveable part 504.

As may be seen in FIGS. 2A and 2B, the fixed part 502 is integral with a substrate 510 which extends under the entire MEMS and/or NEMS structure and is electrically insulated therefrom by an electrically insulating layer 512. The thickness of the fixed part 502, which is electrically conducting, is equal to e2. The moveable part has a thickness e1. In this example and in a preferred manner, on account of the production method the fixed part 502 and the moveable part 504 are from the same layer made of electrically conducting material, for example made of semiconductor material. The result is that e1=e2.

The thickness of the actuating beam is designated e3 and the thickness of the connecting element is designated e4.

In the example represented, the actuating beams advantageously have a thickness less than the thickness of the moveable part and the thickness of the connecting element, and very advantageously less than half of the thickness of the moveable part and half of the thickness of the connecting element, i.e. $e3 \leq e2/2$ and $e3 \leq e4/2$. The advantages resulting from this choice of thickness will be described below.

The fixed part 502, the moveable part 504, the actuating beams 506 and the connecting element 508 are made from one or more electrically conducting materials.

The connecting element(s) may also form suspension means. They may advantageously have considerable out-of-plane stiffness limiting out-of-plane displacements of the moveable part.

Preferably, the width of the actuating beam is chosen so as to have an aspect ratio comprised between 1 and 2.

Preferably, the actuating beams have a length greater than or equal to at least 10 times their longest transversal dimension. The ratio between the length and the longest transversal dimension is advantageously comprised between 5 and 200. It should be noted that the greater the length of the actuating beam, the more the operating range of the actuating beam is reduced on account of the buckling phenomenon.

In the dimensioning of actuating beams the buckling limit is taken into account. The buckling limit decreases with $L^2$: For example, for a beam 12 μm long, the maximum allowed compressive stress is 300 MPa for a section of 250 nm×250 nm. In this precise case, the L/t ratio reaches 48. The sought after stresses to achieve the actuation may attain several hundreds of MPa for the highest values.

Long actuating beams offer better performances.

In fact, long actuating beams have higher electrical resistance. The overall efficiency of the Joule power may then be improved and the necessary currents may be lower, which makes it possible to reduce the power supplied by the current source for the same performances.

Long actuating beams offer very high thermal insulation which makes it possible to increase the self-heating effect during the passage of an electric current at constant electrical power, or to reduce electrical consumption at constant electrothermal force.

The beam has for example a section of 250 nm×250 nm and the length of the actuating beam is for example comprised between 100 nm and 100 μm.

e3 is for example comprised between 10 nm and 100 μm and e1 and e2 are for example comprised between 20 nm and 100 μm.

The actuating beams may be made with materials suited to the production of MEMS and/or NEMS structures. The actuating force generated by a beam depends on the product of the coefficient of expansion α and the Young's modulus E. This product is preferably maximised.

For example, for silicon: α=2.6 ppm/K and E=169 GPa, for silicon nitride: α=3.26 ppm/K and E=1125 GPa and for silicon carbide: α=4 ppm/K and E=450 GPa. Silicon carbide is particularly advantageous.

The MEMS and/or NEMS structure is intended to be connected to two current or voltage polarisation sources designated for example by contact pads P1, P2 produced on the fixed part on either side of the moveable part. This source S may be alternating or direct.

In the remainder of the description and for the sake of simplicity, a source of electric current that will be designated "current source" will uniquely be considered.

Each actuating beam 506.1, 506.2 is intended to be traversed by a current Ia, Ib respectively. For example two distinct current sources are each connected to a contact pad P1, P2 respectively situated on the fixed part 502 near to the actuating beams 506.1, 506.2. The contact pads P1 and P2 are only electrically connected to each other by the MEMS and the actuating beams. This supply of each actuating beam 506.1, 506.2 by a different current is made possible by the presence of the connecting element that forms a conduction path distinct from the actuating beams, and enables the currents Ia and Ib to flow via the connecting element to the fixed part. The connecting element is thus traversed by the current Ia+Ib.

Each current Ia, Ib may be controlled separately and enable the generation of different electrothermal forces in each actuating beam. For example, the currents Ia and Ib may be square-wave signals in phase opposition or sinusoidal currents for example also in phase opposition. It is then possible to have a constructive interference of the electrothermal forces applied by the two aligned actuating beams.

The currents Ia, Ib flowing in the actuating beams 506.1, 506.2 cause the self-heating of each of the beams and the generation of an electrothermal force in each of the beams. Since the currents may be commanded separately they may be commanded such that the electrothermal forces generated are constructive.

The connecting element 508 is traversed by the currents Ia and Ib, it assures the closing of the electrical circuit. The connecting element 508 also undergoes self-heating but due to its spring-shaped configuration, the different branches perpendicular to the X axis can expand freely and the force exerted by the connecting element 508 on the moveable part 504 is negligible with respect to that exerted by the actuating beams. Furthermore, by choosing a connecting element of which the stiffness is low in the direction X with respect to the stiffness of the MEMS and/or NEMS structure, the thermoelastic deformation mainly takes place on the connecting element 508. A very weak actuating force is then exerted on the moveable part 504.

Thanks to the structure of FIG. 1, the moveable part may be displaced to the right or to the left from its position of equilibrium by activating one or the other of the actuating beams by electrothermal effect. Since the activation current I1 or I2 flows in the connecting element 508 and not in the other actuating beam, there is no generation of a force in the other actuating beam which would oppose the displacement of the moveable part. In structures with electrothermal actuation of the prior art, such displacements in one sense or in the opposite sense on command from a position of equilibrium cannot be envisaged.

Advantageously, by choosing the thickness of the actuating beams very much smaller than those of the moveable part and the connecting element, the resistance of the beam is greater than that of the moveable part, which enables access of the current to the actuating beams.

There is a concentration of the current density in the actuating beams, which favours a higher rise in temperature therein in comparison with the fixed and moveable parts. The power supplied mainly serves to heat the beams and thus to generate a force by electrothermal effect. The greater the heating, the higher this force. Better energy efficiency is then obtained.

If the current is an alternating current, the moveable part is made to vibrate. The vibration frequency may be all the higher the lower the thermal time constant of the actuating beams, this is notably the case when it has small dimensions. The length of the beam is for example comprised between 100 nm and 20 μm.

The thickness of the fixed part is not taken into account, because said part has a very large surface with respect to that of the moveable part and the connecting element, consequently its resistance is typically much less than those of the moveable part and the connecting element. Moreover, the dimensioning constraints imposed by the specification of the MEMS apply to the moveable part. For the connecting element, it cannot be envisaged or it is difficult to envisage that it has a large width, otherwise it could perturb the mechanical operation of the structure.

As an example, let us consider a MEMS and/or NEMS structure in which the actuating beam has a thickness of 0.25 µm, a width of 0.25 µm and a length of 5 µm and in which the connecting element has a thickness of 1 µm, a width of 2 µm and a length of 50 µm. Let us further consider that the access resistance is mainly that of the connecting element. In addition the actuating beams and the connecting element are made from the same material.

The efficiency r for each actuating beam is written:

$$r = \frac{Pbeams}{P\,total} = \frac{Rbeam}{R\,beam + access} = 96\%$$

The implementation of actuating beams having small thickness, advantageously makes it possible to attain beam resistances of several thousands of Ohms. Such resistances make it possible to attain actuating currents in the range 100 µA-1 mA with the aid of a generator of the order of 1V. The current delivered by the generator is close to or in the targeted current range. In these conditions, the major part of the power delivered by a 1V generator is transmitted to the actuating beams without having to resort to DC-DC converters.

For example, for actuating beams having dimensions of 0.25 µm×0.25 µm×5 µm, the electrical resistance R of the actuating beam is:

R=4100Ω with a doping 2×10$^{19}$ cm$^{-3}$.
R=1860Ω with a doping 5×10$^{19}$ cm$^{-3}$.

Advantageously, since the connecting element 508 has a thickness very much greater than that of the actuating beams, it also has low electrical resistance, its self-heating is reduced with respect to the beam. The resulting electrothermal force may for example be at least an order of magnitude lower than that generated in the actuating beam. Preferably, the electrical resistance of the connecting element(s) is at least five times lower than that of the actuating beams.

In a variant, the material of the connecting element could be doped in order to have better electrical and thermal conductivity than that of the material of the actuating beams or be made of a material having a lower coefficient of expansion than that of the material of the actuating beam.

It is possible to provide, for example in an application to a sensor, means of detecting movements of the moveable part generated by the electrothermal force. The actuating beams may be made of piezoresistive material forming the detection means. The variation in electrical resistance of the beams makes it possible to know the movement of the moveable part. It will be understood that it is possible to replace each actuating beam by several actuating beams arranged in parallel from an electrical viewpoint and which would be activated by the same current source. In a variant, the detection means may be of piezoelectric type.

Figure 3:
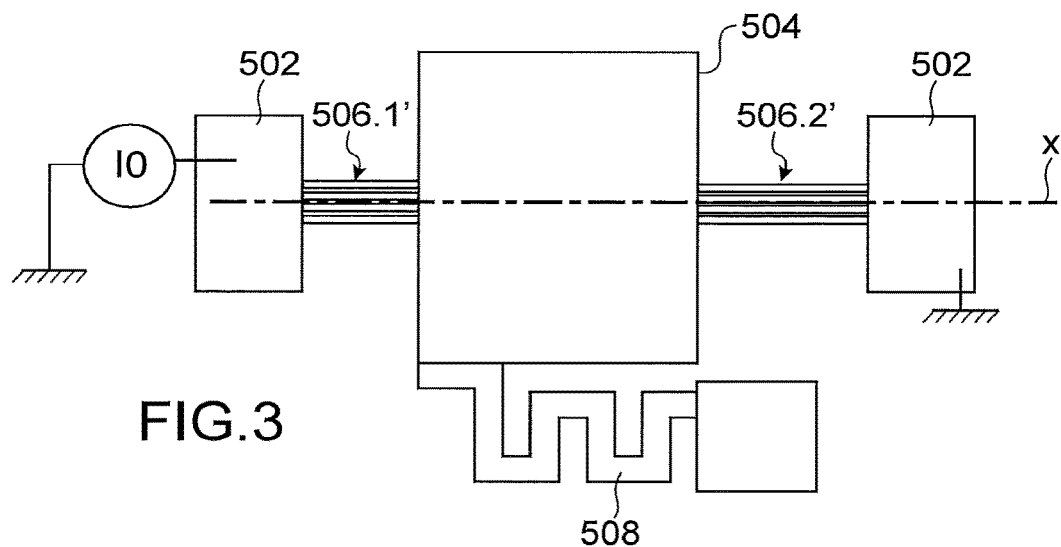
FIG. 3 is a top view of a very advantageous variant of the structure of FIG. 1, implementing nanowires.

In a particularly advantageous manner, the actuating beams may have transversal dimensions such that they form nanowires. In FIG. 3 may be seen an example of such a structure.

Several nanowires 506.1' parallel to each other replace the beam 506.1 and several nanowires 506.2' parallel to each other replace the beam 506.2.

The width and/or the thickness of a nanowire is or are less than 500 nm. At such dimensions, the nanowire has thermal conductivities less than those of the material in volume on account of the intensification of interaction processes of phonon-phonon or phonon-surface type. For example, in the case of silicon, a three-fold reduction may be observed for nanowires of section 250 nm×250 nm, the nanowires have a thermal conductivity of 50 W/m/K whereas solid silicon has a thermal conductivity of 140 W/m/K.

The temperature profile T(x) within a beam of length L traversed by a current of density j may be approached by:

$$T = T_0 + \frac{\rho j^2}{2\kappa} x(L-x)$$

ρ is the resistivity, κ the thermal conductivity. The maximum temperature is reached in the middle of the beam:

$$\Delta T_{max} = \frac{\rho j^2}{8\kappa} L^2$$

Since the amplitude of self-heating is inversely proportional to the thermal conductivity, a nanowire of nanometric section, for example of which the width and/or the thickness is or are comprised between 10 nm and 500 nm, thus benefits from an amplified heating and thus from an actuating force amplified per unit of surface (section of the beam), with respect to an actuating beam of larger dimensions.

Actuating beams in the form of microbeams of several µm transversal dimensions and of length for example between 5 µm to 10 µm have the advantage of having reduced thermal inertia with respect to actuating beams of microsystems of the prior art, the response times in the generation of the force are then shorter during an electrical load. Such actuating beams make it possible to produce MEMS and/or NEMS structures with high resonance frequencies, for example in the frequency range 1 MHz and 1 GHz.

The configuration in which several nanowires representing in total the same section as a single actuating beam is particularly advantageous, because at constant total section, the electrical power consumed is identical to that consumed by a single actuating beam, the mechanical stiffness exerted on the structures at the ends of the nanowire is equivalent, but due to the fact of the amplification described above, the total force exerted by the nanowires is amplified with respect to that applied by a single actuating beam.

This structure then has improved energy efficiency.

If n nanowires replacing a beam are considered, having the same section and the same length, for the nanowire i this gives: $R_i = nR_p$ with $R_p$ the resistance of the beam.

The power in a nanowire is then written $$P_i = R_i \times \left(\frac{I}{n}\right)^2 = \frac{R_p I^2}{n}, \text{ i.e.}$$

the total power in the n nanowires=$\Sigma_i^N P_i = R_p I^2$, i.e. the power consumed by the beam of total equivalent section.

The stiffness of a nanowire $$k_i = \frac{k_p}{n},$$

with $k_p$ the stiffness of the beam, i.e. an equivalent longitudinal stiffness $k = k_p$ identical to the stiffness of the beam of total equivalent section.

The time constant for each nanowire is written $\tau_i = R_{th_i} C_i = R_{th_i} C$ in the case where the material parameters are unchanged.

With $R_{th} = \dfrac{L}{S\kappa}$ $C = cLS$ $R_{thi} = \dfrac{nL}{S\kappa_i}$ $C_i = \dfrac{cLS}{n}$ c is the thermal capacity per unit of volume, C the thermal capacity of the actuating beam, $C_i$ the thermal capacity of a nanowire, κ the thermal conductivity of the actuating beam, $\kappa_i$ is the thermal conductivity of the nanowire, S the section of the actuating beam and S/n the section of a nanowire, L the length of the actuating beam and a nanowire. In practice, the time constant or response time increases slightly since the thermal conductivity decreases. It is possible to compensate at least in part this increase by reducing the length of the nanowire. The response time of a nanowire may be greater than that of a thicker nanowire on account of the reduction in the thermal conductivity.

The nanowires may for example be produced by planar etching techniques that make it possible to attain widths of beams of the order of 100 nm using the deep ultraviolet etching method or 5 nm using the e-beam lithography method, while conserving identical dimensions for the remainder of the MEMS/NEMS structures.

The thickness of the nanowires may be obtained by implementing a thinner structural layer than that used for the remainder of the MEMS structure. Such a method of production implementing two structural layers is well known to those skilled in the art.

The structure according to the invention makes it possible to have actuating beams of reduced size in comparison with the moveable part that it or they make move while conserving good actuating efficiency. For example, the ratio between the surfaces of the planar structures of the MEMS (these surfaces include that of the moveable part and fixed tracks used for the polarisation) and of the beam may typically reach factors of 1000-10000. In terms of volume, the ratio may be comprised between 10000 and 100000.

Figure 4:
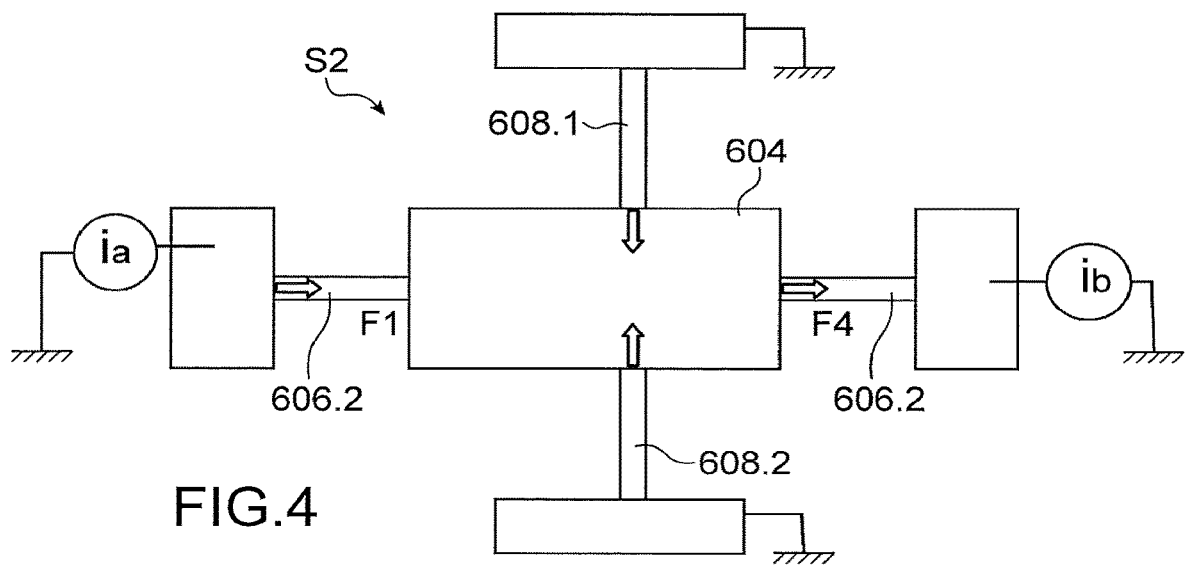
FIG. 4 is a top view of another example of embodiment of a MEMS and/or NEMS structure.

In FIG. 4 may be seen another example of structure S2.

The structure S2 comprises two aligned actuating beams 606.1, 606.2, arranged on either side of the moveable part 604. It comprises two connecting elements 608.1 608.2 aligned and extending along a direction perpendicular to the direction of the actuating beams. Currents Ia, Ib traverse the actuating beams 606.1, 606.2 respectively and then flow to the fixed part via the connecting elements 608.1, 608.2. The electrothermal forces generated in the connecting elements 608.1, 608.2 compensate each other and do not perturb the displacement of the moveable part.

A structure comprising n actuating beams, n being at least equal to 2 and m connecting elements, m being at least equal to 1, and q independent current sources, q being comprised between 2 and n included, flowing in the n actuating beams, does not go beyond the scope of the present invention.

Figure 5:
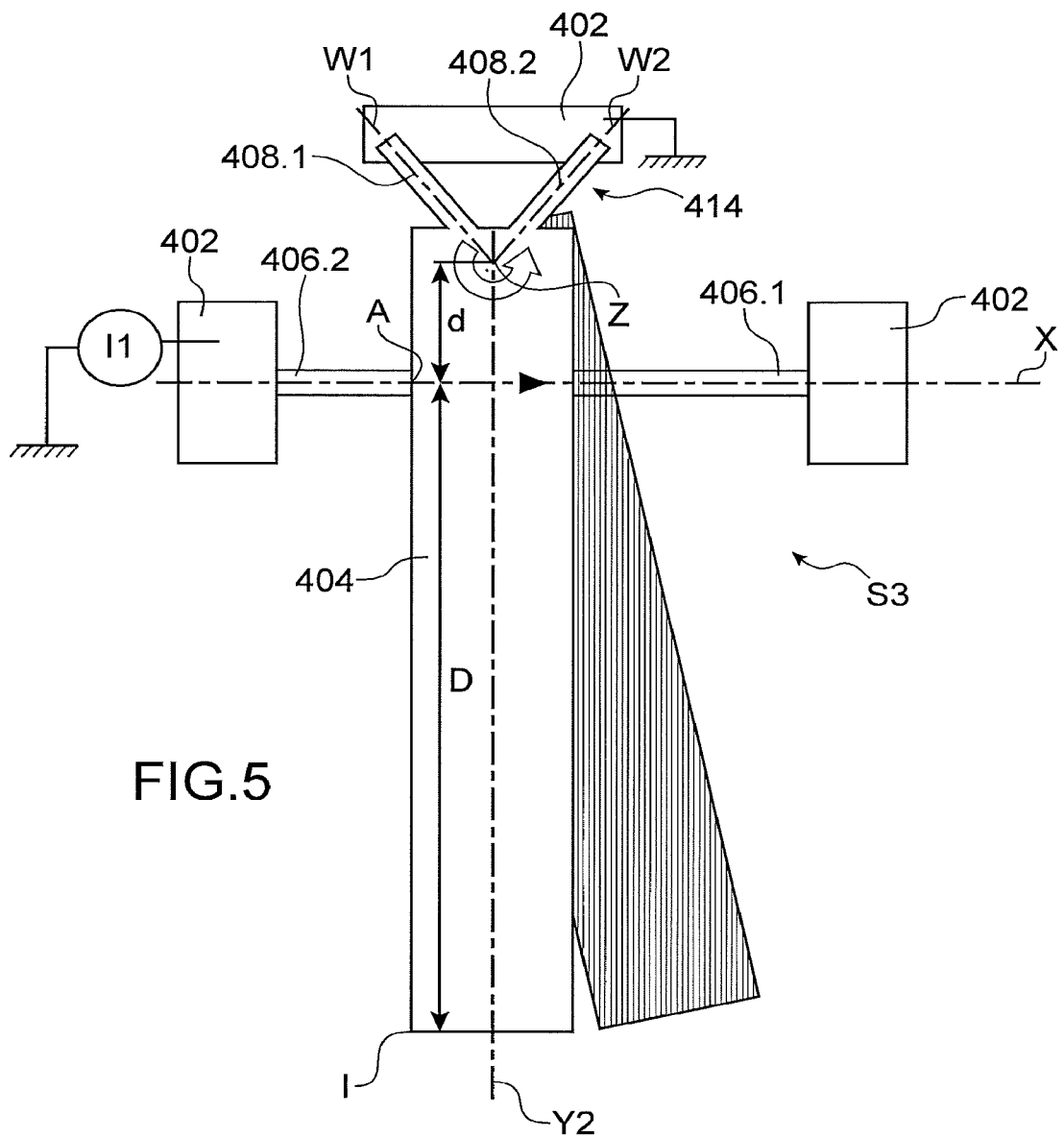
FIG. 5 is a top view of another example of embodiment of a MEMS and/or NEMS structure.

In FIG. 5 may be seen another example of structure S3 in which the moveable part is articulated in rotation in the plane.

The structure S3 comprises a fixed part 402, a moveable part 404, a hinge 414 between the moveable part 404 with respect to the fixed part, and two actuating beams 406.1, 406.2 between the fixed part and the moveable part.

The hinge comprises an axis of rotation Z perpendicular to the plane of the structure and two arms forming two connecting elements 408.1, 408.2. The two connecting elements 408.1, 408.2 are connected to the fixed part 402 and to the moveable part 404 and are inclined with respect to each other such that their axes W1, W2 are secant at the level of the moveable part 404, the axes W1 and W2 being secant in Z. As a non-limiting example, the angle between the axes W1 and W2 may for example be equal to 90°.

The X axis of the actuating beams and the axis of rotation Z are not secant, such that an electrothermal force applied along the X axis causes a rotation of the moveable part around the Z axis. The moveable part 404 is displaced anticlockwise under the effect of the force, the moveable part then takes the position represented in dotted lines, and clockwise when the force ceases.

A self-heating of the actuating beams 406.1, 406.2 thus causes a rotation of the moveable part 404 around the Z axis.

Preferably and as is represented in FIG. 5, the structure S3 makes it possible to amplify the amplitude of displacement of a point I situated on the moveable part opposite to the Z axis with respect to the X axis of the beams.

In fact, if one considers the distance d, between the point of intersection between the X axis and a Y2 axis forming the longitudinal axis of the moveable part 404 and the point of intersection of Z and Y2, and the distance d between the point of intersection of Z and Y2 and the point I, the amplitude of displacement of point I is amplified with respect to that of the point of intersection between the X axis and the Y2 axis by a D/d ratio.

Ratios of the order of 10 to 200 may easily be produced. Amplitudes of the order of ten or so nanometres at the level of the actuating beam can cause displacements of the point I over more than 1 μm.

Such a structure may for example be implemented to make the inertial masses of a gyrometer move for which the amplitudes of vibration may reach more than 1 μm.

In all the examples of embodiment, the actuating beams may have equal or different dimensions, and in the examples comprising several connecting elements, these may have equal or different dimensions and similar or different shapes.

Figure 6:
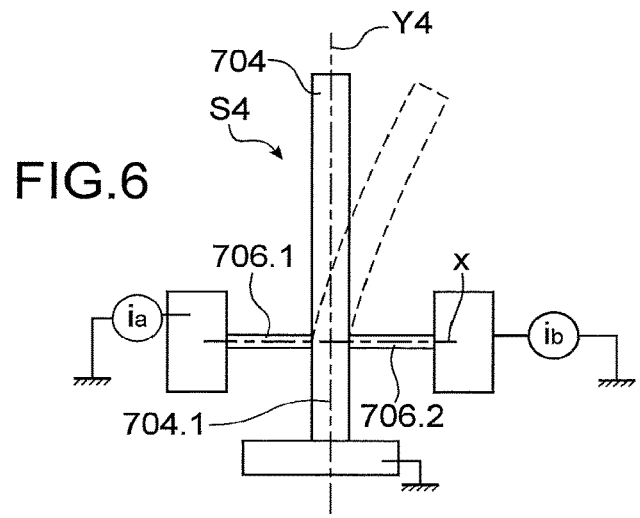
FIG. 6 is a top view of two MEMS and/or NEMS structures according to another example of an embodiment in which the moveable part is deformed in bending.

In FIG. 6 may be seen another example of embodiment of a MEMS and/or NEMS structure S4 in which the moveable part is deformed mechanically by the action of the actuating beam.

Figure S4 comprises a fixed part 702, a moveable part 704 and two actuating beams 706.1 and 706.2, aligned in the example represented and which are traversed by two different currents Ia, Ib. In the example represented, the moveable element extends along a direction Y4 in the plane and perpendicular to the X axis. The moveable part 704 is integral with the substrate at the level of a longitudinal end 704.1 via a built-in link 716. The moveable part is dimensioned to be able to deform in bending under the effect of the electrothermal force applied by the actuating beam.

The built-in link replaces the connecting element, the actuating current flowing through the beam and the built-in link.

When an actuating current flows in one or the other actuating beams 706.1, 706.2, one or the other self-heat by Joule effect which generates an electrothermal force that is applied to the moveable part 704. On account of the perpendicular direction of the electrothermal forces with respect to the axis of the moveable part, it deforms in bending as is represented in dotted lines in FIG. 9A.

Any other orientation of the actuating beams with respect to the moveable part causing the deformation of the moveable part according to a mode other than a bending mode and/or in an out-of-plane direction does not go beyond the scope of the present invention. The actuating beams make it possible to actuate a deformable structure of dimensions equal to or slightly greater than its own dimensions.

It may be provided that the beams are not aligned then causing several deformation zones of the moveable part by simultaneously applying to them an independent current.

Figure 7A:
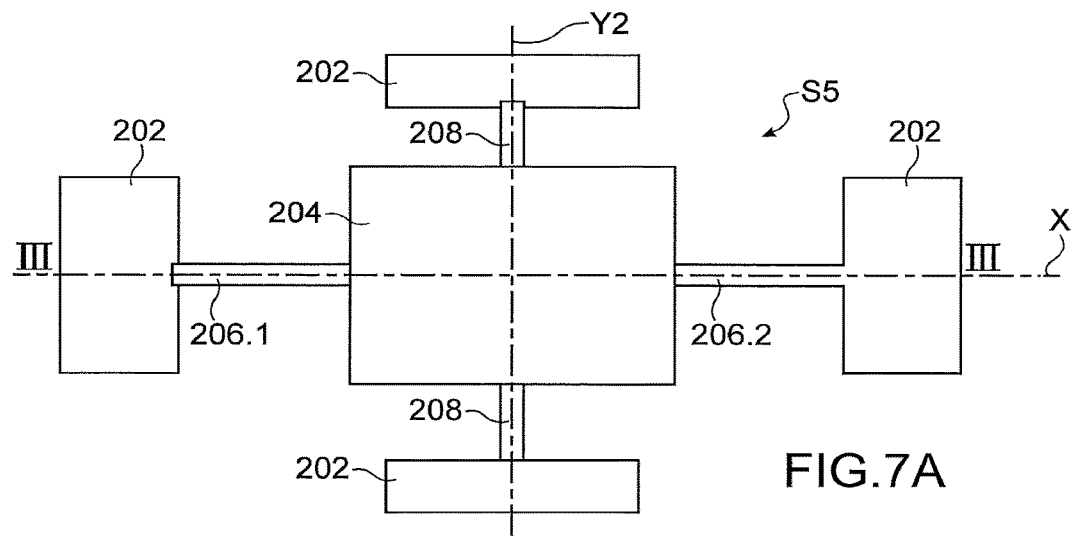
FIG. 7A is a top view of an example of embodiment of a MEMS and/or NEMS structure according to the invention with out-of-plane rotation movement.
Figure 7B:
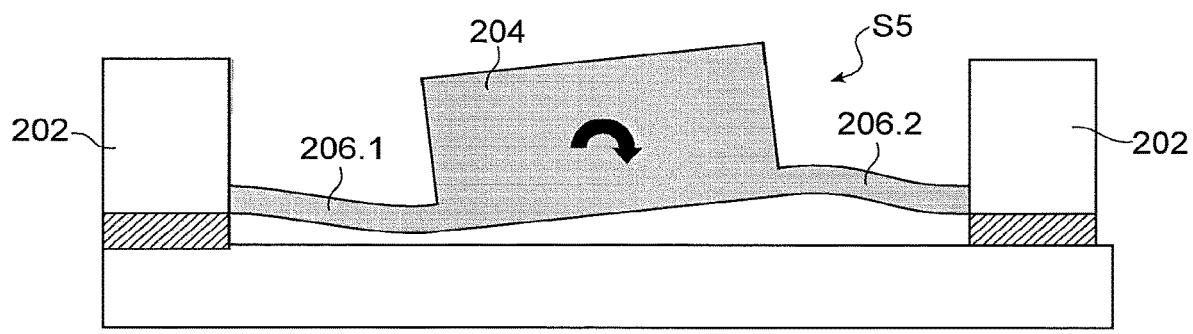
FIG. 7B is a longitudinal sectional view of the structure of FIG. 7A along a plane III-III during actuation.

In FIGS. 7A and 7B may be seen an example of embodiment of a structure S5 in which the moveable part may have an out-of-plane rotation movement.

The structure S5 comprises two connecting elements 208 formed by beams and extending perpendicularly to the axis of the actuating beams 206.1, 206.2 on either side of the moveable part 204. The connecting elements 208 are aligned along an axis Y2. Moreover, the actuating beams 206.1, 208.2 comprise a lower face in the same plane as the face of the moveable part facing the substrate. Furthermore, the axis Y2 and the actuating beams 206.1, 206.2 are in different planes, for example the connecting elements 208 are situated in the median plane of the moveable part 204. The axis of rotation is situated approximately in the median plane containing the elements 208.

The connecting arms 208 are produced so as to have sufficient stiffness to bending and to be torsionally deformable in order to form an axis of rotation for the moveable part as may be seen in FIG. 7B. In fact the electrothermal force that appears within one or the other of the actuating beams 206.1, 206.2, is exerted on the moveable part 204 which is fixed to the fixed part 202 by the connecting elements 208, which torsionally deforms around the Y2 axis. The moveable part 206 then pivots around the X axis clockwise or anticlockwise depending on the actuating beam that is self-heated.

The actuating beams may be situated in any position with respect to the moveable part different to the plane containing the Y2 axis of the connecting arms 206.

This structure with out-of-plane actuation is particularly advantageous because out-of-plane actuation is difficult to achieve with structures of the prior art, for example with actuation of capacitive type. In fact in a structure comprising capacitive electrodes of inter-digitate comb type, the mechanical moment at the level of an axis of rotation situated at the level of the median plane of the MEMS structure is zero. It is then necessary to add planar electrodes located above or below the MEMS, which makes manufacture more complex.

It is possible to envisage a structure comprising an actuating beam in the upper part of the structure and an actuating beam in the lower part, the simultaneous activation of the two actuating beams causing the tilting of the moveable part. The two polarisation sources polarise the two beams in the same manner. It may be envisaged only to implement a single polarisation source and not to have any electrically conductive connecting element.

Figure 8:
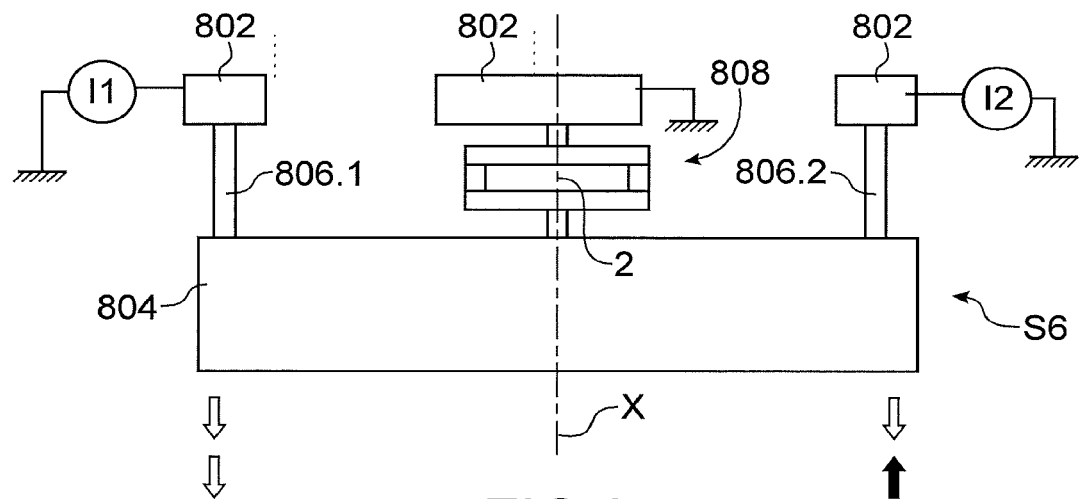
FIG. 8 is a top view of an example of embodiment of a MEMS and/or NEMS structure, the moveable element being able to be displaced in rotation and/or in translation.

In FIG. 8 may be seen another example of a MEMS and/or NEMS structure S6.

The structure S6 comprises a fixed part 802, a moveable part 804, two actuating beams 806.1, 806.2 parallel and connected to a same side of the moveable part and a connecting element 808 also connected to the same side of the moveable part as the actuating beams. The connecting element 808 has a certain elasticity enabling the structure 804 to displace in the plane in translation along X and enables the pivoting of the mass around the direction Z.

This structure makes it possible to control finely the mechanical modes that it is wished to excite. For example, the amplitude and the phase in the case of sinusoidal signals of currents traversing the actuating beams may be adapted in order to favour the excitation of a given mechanical mode.

For example, in the case of direct actuating currents in phase in the two actuating beams 806.1, 806.2, the moveable part 804 is displaced in translation along the X axis. In the case of direct actuating currents in antiphase, the moveable part is displaced in rotation around the Z axis.

Let $I_1$ note the current flowing in the beam 806.1 and I2 the current flowing in the actuating beam 806.2.

In the case where direct actuating currents are considered, by writing $I_1=i_a+i_b$ and $I_2=i_a+\epsilon \times i_b$, knowing that the actuating force is proportional to the square of the intensity, the force components are written:

For the beam 806.1:

$$F_1 \propto i_a^2 + i_b^2 + 2i_a i_b$$

For the beam 806.2:

$F_2 \propto i_a^2 + i_b^2 + 2i_a i_b$ si $\epsilon=1$, the two forces are then in phase. The two beams undergo the same self-heating and electrothermal forces of same intensity are generated, the moveable part is displaced in translation. The connecting element 808 deforms along the direction X.

$F_2 \propto i_a^2 + i_b^2 - 2i_a i_b$ if $\epsilon=-1$, the two forces then comprise an antiphase term. The two beams do not undergo the same self-heating and electrothermal forces of different intensities are generated, the moveable parts are displaced in rotation around the Z axis. The connecting element 808 deforms around the Z axis.

In the case where sinusoidal actuating currents are considered, by writing $I_1=i_a \sin \omega t$ and $I_2=i_a \sin \omega t+\varphi$, this gives For the beam 1:

$$F_1 \propto i_a^2 \frac{1-\cos 2\omega t}{2}$$

For the beam 2:

$$F_2 \propto i_a^2 \frac{1-\cos 2\omega t + 2\varphi}{2}.$$

By choosing $$\varphi = \frac{\pi}{2}$$

for example forces $F_1$ and $F_2$ in phase opposition are obtained for the component at $2\omega$ causing a rotation of the moveable part.

A component in static phase exists, a shift in the position of the moveable part with respect to its equilibrium position ensures therefrom.

Considering the structure S1 of FIG. 1, in which the two actuating beams are aligned on either side of the moveable part, the resultant of the forces in phase opposition applied to the moveable part may be written:

$$\Sigma F \propto \cos 2\omega t$$

The structure S1 makes it possible to eliminate the static components.

Figure 9:
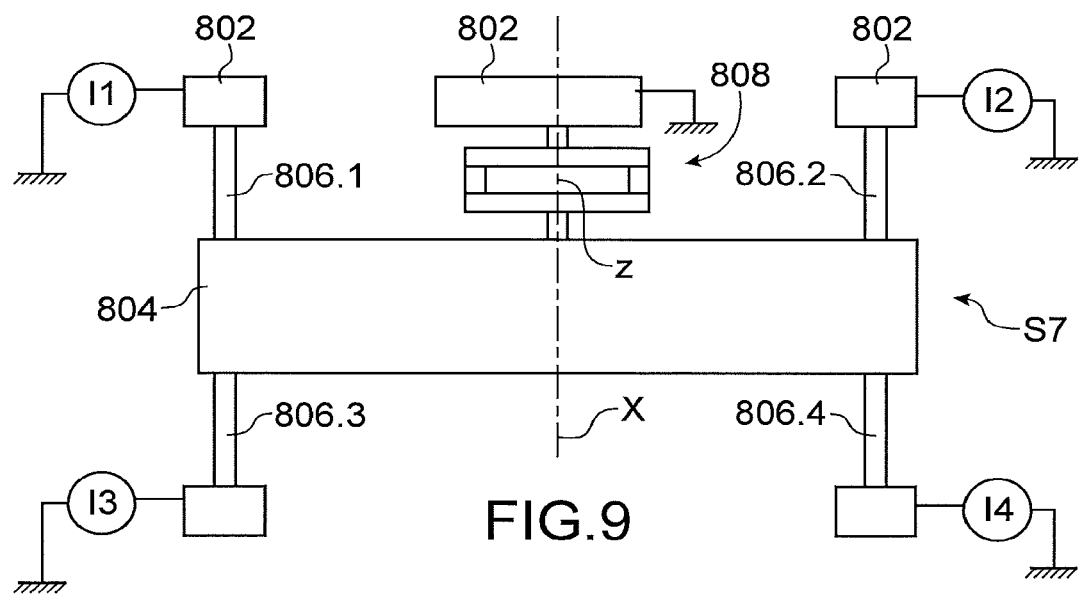
FIG. 9 is a top view of an example of embodiment of a MEMS and/or NEMS structure with four actuating beams.

In FIG. 9 may be seen another example of structure S7 with four actuating beams also making it possible to eliminate the static components. The structure S7 comprises, with respect to the structure S6, two additional actuating beams, a beam 806.3 aligned with the beam 806.1 and connected to the side of the moveable part 804 opposite to that to which is connected the beam 806.1 and a beam 806.4 aligned with the beam 806.2 and connected to the side of the moveable part opposite to that to which is connected the beam 806.2.

Each actuating beam 806.1, 806.2, 806.3, 806.4 is supplied by its own actuating current I1, I2, I3, I4 respectively. Each current generates a self-heating and electrothermal forces that apply on the moveable part.

By applying, for example, quadrature sinusoidal currents i1 and i3 and quadrature sinusoidal currents i2 and i4, it is possible to eliminate the static components, the moveable part 804 then being able to be displaced in translation along the X axis.

If moreover the currents i1 and i2 are quadrature and i3 and i4 are quadrature, the moveable part 804 may be excited in rotation around the Z axis.

It will be understood that by choosing a suitable phase between the currents flowing in the different actuating beams, it is possible to optimise the excitation of a desired mode for any structure, for example in the case of structures comprising several moveable parts, each with several degrees of freedom.

Moreover, in a very advantageous manner, the structures according to the invention may make it possible to compensate the thermal flux seen by the moveable part and resulting from the application of the actuating current.

In fact, in a structure with electrothermal actuation of the prior art, the application of a voltage or current sinusoidal signal, a thermal energy flux is applied to the structure which causes a temperature modulation of the structure and in particular of the moveable part. This modulation may have effects on the mechanical response of the structure by modifying the stiffness of the connecting element.

In the case of an application to an enslaved pressure sensor, this temperature modulation may heat the gas of which the pressure varies with temperature. Such a temperature modulation perturbs the measurements.

A structure with at least two actuating beams supplied by different currents may make it possible to avoid, or at least to limit, this temperature modulation of the structure.

Figure 10:
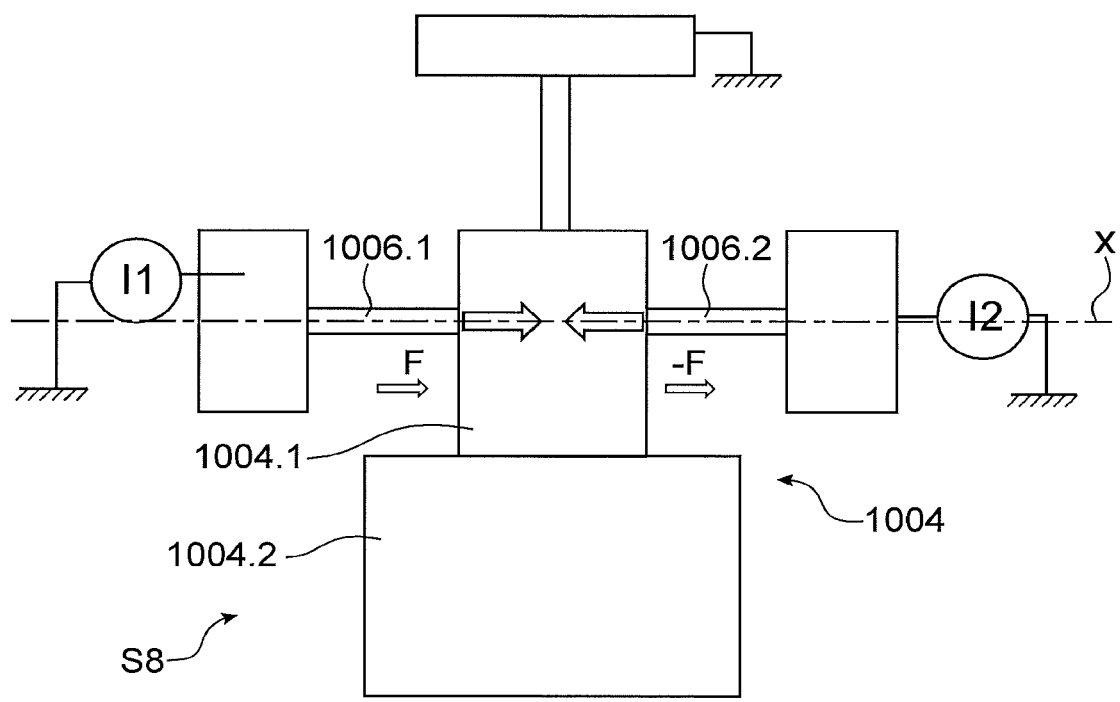
FIG. 10 is a top view of an example of embodiment of a MEMS and/or NEMS structure with two actuating beams each activated by a different current source, particularly adapted to a compensation of the thermal flux.

In FIG. 10 may be seen a structure S8 that is very similar to the structure S1. In the structure S8, the connecting element is straight and not in crenelated spring shape. The actuating beams are aligned along the X axis on either side of the moveable part 1004. In a very advantageous manner, the longitudinal ends of the actuating beams 1006 which are anchored on the moveable part 1004 are situated at a short distance from each other. In the example represented, the moveable part 1004 comprises a narrow part 1004.1 in the sense of the direction X between the two actuating beams 1006.1, 1006.2, and a wider part 1004.2 situated outside of the space between the beams. The part 1004.2 may form the functional part of the moveable part 1004 and the part 1004.1 form the actuation or excitation part. The ends for anchoring the actuating beams 1006.1, 1006.2 on the moveable part 1004 are thus brought closer together. The distance separating the anchorings is for example 5 times less than the dimension of the moveable part in the direction of alignment of the anchorings, it is for example comprised between 10 nm and 50 μm, for example equal to 10 μm.

A current is applied to the actuating beam 1006.1 so as to cause a heating of the beam $T_0+\Delta T$ and a current is applied to the actuating beam 1006.2 so as to cause a heating of the beam $T_0-\Delta T$.

Figure 11:
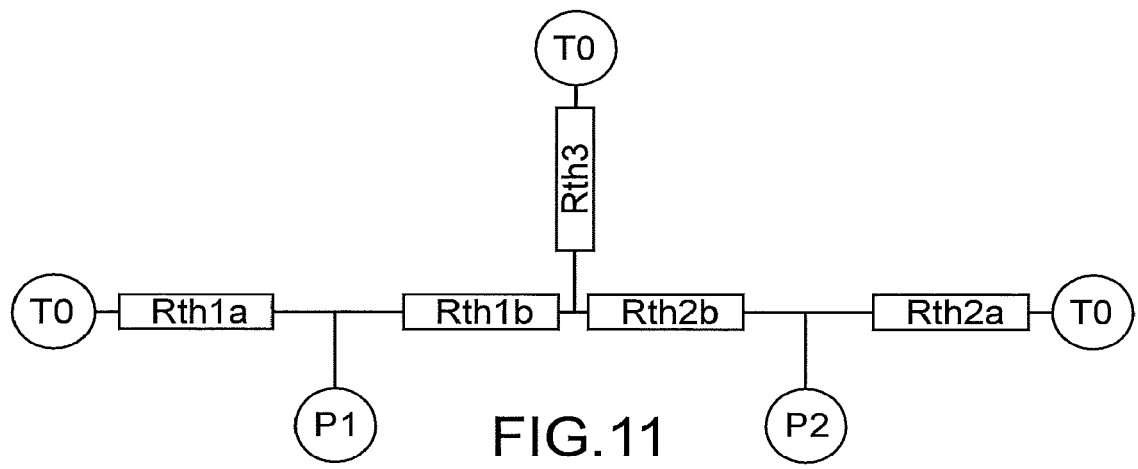
FIG. 11 is a representation of the thermal diagram of the structure of FIG. 10.

In FIG. 11 may be seen the thermal circuit of the structure S8.

Rth1$a$ is given by the thermal resistance of the actuating beam 1006.1, Rth2$a$ is given by the thermal resistance of the actuating beam 1006.2, Rth1$b$ and Rth2$b$ are thermal resistances that comprise a contribution of the actuating beams 1006.1 and 1006.2 and of the moveable part 1004. Rth3 is the thermal resistance of the connecting element.

By Joule effect, the actuating beams produce thermal fluxes P1 and P2 respectively. The fluxes at the level of the moveable part compensate each other perfectly if Rth1$a$=Rth2$a$ and Rth1$b$=Rth2$b$ for identical power levels.

The variable components are thus cancelled out. The structure is then heated to constant temperature.

The currents may be in the form:
$I_1 = i_0 + i_m(t)$ for the beam 1006.1,
$I_2 = i_0 - i_m(t)$ for the beam 1006.2

One then has $\Delta T = 2 i_0 i_m$ and $T_0 \propto i_0^2 + i_m^2 \sim i_0^2$ if $i_0 \gg i_m$. It is possible in fact, for a given heating $\Delta T$, to increase $i_0$ and to take $$i_m \propto \frac{1}{i_0}$$

to reduce the non-compensated component. Ideally, the currents are of the form, taking $i_0 > i_m(t)$:

$$I_1 = i_0 \sqrt{1 + \frac{i_m(t)}{i_0}}$$

for the beam 1006.1

$$I_2 = i_0 \sqrt{1 - \frac{i_m(t)}{i_0}}$$

for the beam 1006.2

In the event of harmonic excitation, it is advantageous to take:
$I_1 = i_a \sin \omega t$ for the beam 1006.1,
$I_2 = i_a \cos \omega t$ for the beam 1006.2.
Which produce the heatings:
For the beam 1006.1:

$$T_1 \propto \frac{1 + \cos 2\omega t}{2}$$

For the beam 1006.2:

$$T_2 \propto \frac{1 - \cos 2\omega t}{2}$$

This then gives $\Delta T \propto \cos 2\omega t$ and $T_0$ is a constant.

The thermal flux injected in the structure only conserves its static component, it is thus constant: in fact the flux is proportional to the sum $I_1(t)^2 + I_2(t)^2 = i_a^2$ which is constant.

The structure and in particular the moveable part 1004 do not undergo any temperature modulation. It is heated to a given temperature which may be taken into account in the dimensioning of the structure or the actuation thereof and/or in the processing of the signals that it transmits to compensate this constant rise in temperature. In the case of NEMS structure of which the dimensions of the moveable part may be close to those of the actuating beams, the rise in temperature produced by the thermal flux may be very important because the thermal resistance of the connecting element may be of the same order of magnitude as that of the actuating beams: the flux compensation makes it possible to reduce in an efficient manner the temperature modulated component of the NEMS and thus to maintain constant the physical properties of the NEMS. For example, functional layers used to adsorb chemical or biological elements may be cited, for example implemented in gravimetric mass sensors, or magnetic layers, quantum dots integrated in a NEMS, etc.

In a variant, the amplitude of one and/or the other of the currents traversing the actuating beams could be modified to eliminate or at least reduce the dynamic component of the resulting thermal flux applying to the structure.

This compensation of thermal flux may be very advantageous when the structure comprises means of detecting the displacement of the moveable part for example in the case of a sensor, and more generally when the structure comprises temperature sensitive transduction organs.

Figure 12:
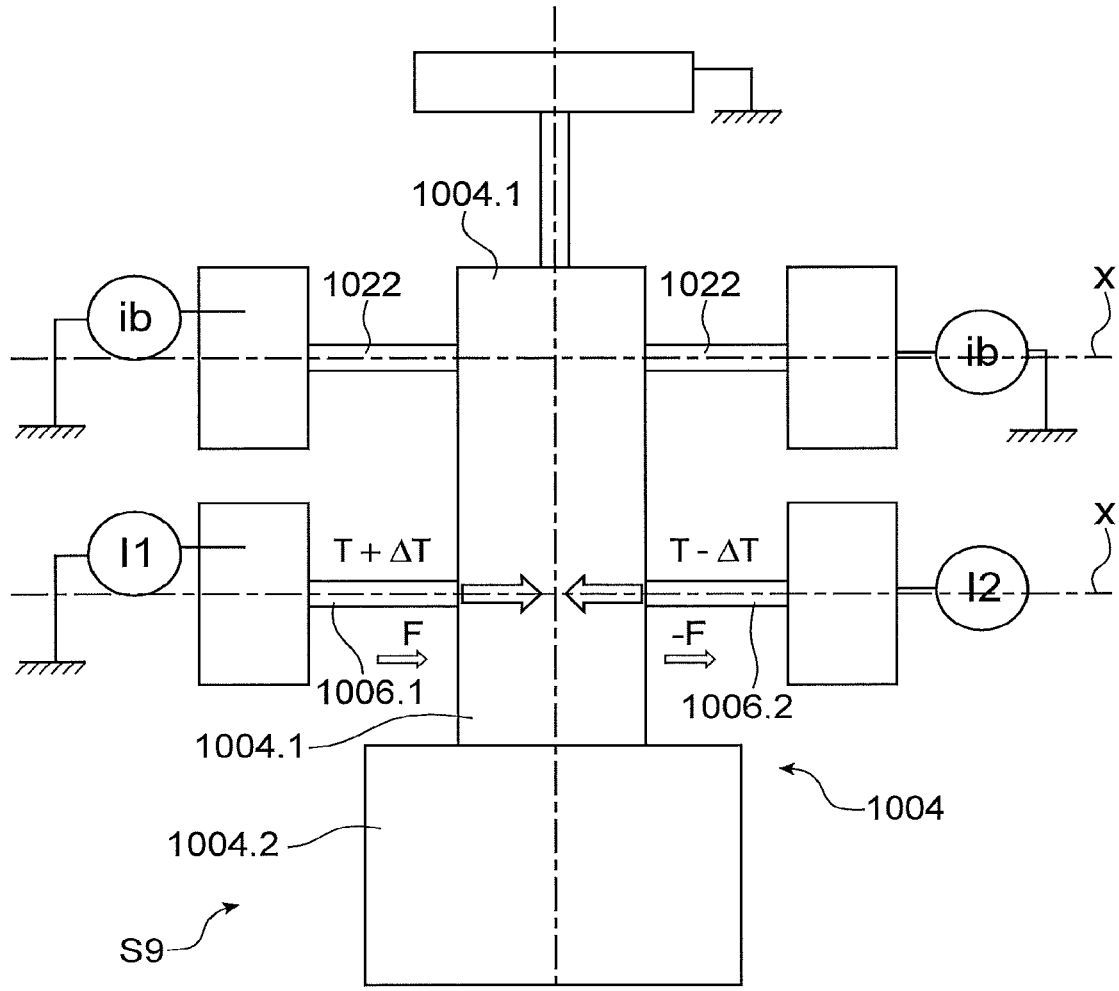
FIG. 12 is a top view of a variant of the structure of FIG. 10 comprising means of detecting a displacement of the moveable part.

In FIG. 12 may be seen a structure S9 very similar to the structure S8, comprising in addition piezoresistive transduction means 1022 or piezoresistive gauges. These gauges are sensitive to temperature variations. In the example represented, the gauges are suspended between the fixed part 1002 and the narrow part 1004.1 of the moveable part 1004 parallel to the actuating beams and on either side of the moveable part, enabling for example a differential measurement.

The currents I1 and I2 traverse the actuating beams 1006.1, 1006.2.

Figure 13:
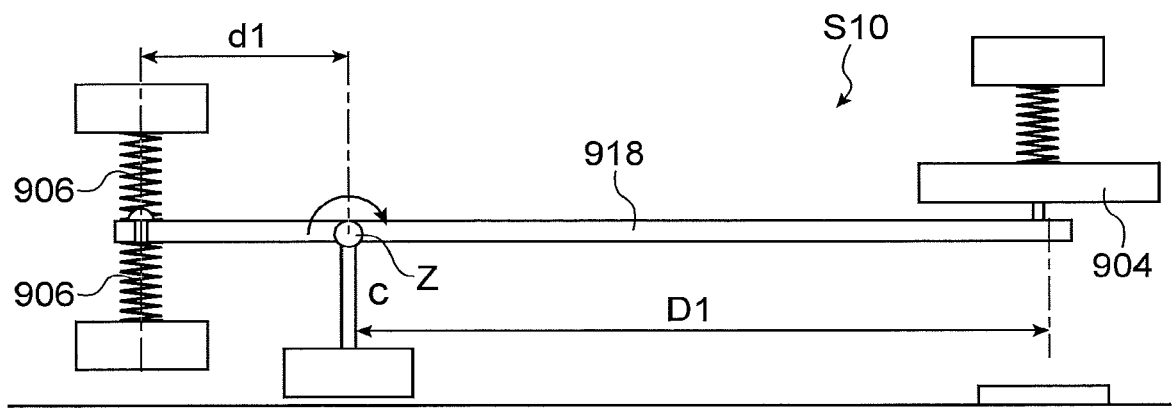
FIG. 13 is a schematic representation of a MEMS and/or NEMS structure comprising means of modifying the intensity of the force applied to the moveable part by an electrothermal actuating beam.
Figure 14:
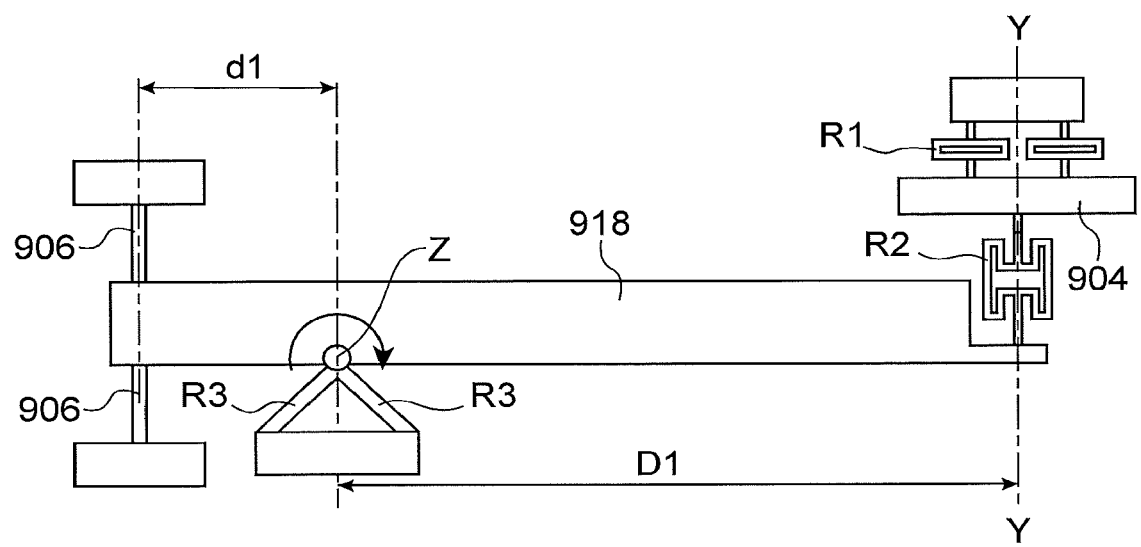
FIG. 14 is a schematic representation of a variant of the structure of FIG. 13.

When the thermal fluxes generated by the actuating beams 1006.1, 1006.2 are compensated at the level of the moveable part as has been described in relation with FIGS. 13 and 14, there is no temperature modulation that is transmitted to the gauges by the moveable part, the temperature modulation synchronous with the movement of the moveable part is then considerably reduced, which has the effect of considerably reducing the thermal signal, also called measurement background, at the level of the piezoresistive gauges. The heating to a constant temperature of the gauges is taken into account in the processing of the signals that they generate.

The polarisation current ib of the gauges may be either static, or modulated to a frequency $\omega_b$ different to the frequency of mechanical vibration in order not to generate a background component that is superimposed on the mechanical signal, since a Joule effect also appears within the gauges. On the other hand, a thermal component may be generated at $\omega_b$ and its harmonics on the structure. The polarisation current of the gauges may nevertheless be chosen sufficiently low to limit undesirable effects on the structure.

In a very advantageous manner, the actuating beams may also be used to measure the movements of the moveable part by exploiting the piezoresistivity properties of the material of the beam. The actuation and detection functions may thus be supplied by the same beam. This makes it possible to reduce the number of external connection pads which imposes severe constraints on the sizes of the component, in fact pads of 50×50 µm may be necessary to assure a wired connection. The bulk of the structure is further reduced and its production is simplified.

In all the examples represented, the pads may be voltage or current polarised in order to adapt the current levels that traverse the actuating beams.

In all the examples of embodiment, the structures may comprise several moveable parts displaced by several actuating beams activated by several current or voltage sources. Furthermore, the actuating beams could be connected directly to two moveable parts and not directly to a fixed part and to a moveable part, the moveable parts being suspended from a fixed part, the suspension means making it possible to lead the current up to the actuating beams.

The actuating beams may be used to carry out self-testing, for example for microphones, accelerometers, etc. A microphone or an accelerometer does not necessitate actuating means for its operation. Nevertheless, it is possible to provide such actuating means to assure the integrity of the mechanical response of the moveable structure. By using the detection gauges as actuating means, it is possible to respond to this problem without adding connection pads to the actuating electrodes and thus to reduce the constraints on the dimensions of the component. Due to the low bulk of beams with electrothermal actuations their integration is not or is hardly problematic.

The implementation of an electrothermal actuation makes it possible to produce a structure having a very small bulk. Moreover, advantageously, the structure may have high energy efficiency, such a structure is particularly adapted to integration in portable devices and in sensors that it is sought to miniaturise.

Actuating beams may be used to compensate the important strains produced by accelerations for example. Enslavement by capacitive actuating means may in certain cases require very high voltage levels that are difficult to have available for autonomous or mobile platforms. Thanks to the present invention, on account of the high intensity of the electrothermal force which may be obtained, such enslavement may be envisaged.

The MEMS and/or NEMS structure is produced by microelectronic and/or nanoelectronic techniques well known to those skilled in the art.

The invention may make it possible to produce gyrometers, the beams serving to excite the moveable part(s) of the gyrometer and potentially to detect their displacement.

The invention may be used in the field of resonating sensors and actuators, for example for producing oscillators for time bases, the detection of biochemical mass, etc. and in the field of systems using actuators requiring the generation of important forces in order to position or displace a mechanical element, such as a switch, a mirror, or to compensate external efforts via a feedback loop, for example in enslaved accelerometers, gyrometers.

In FIG. 13 may be seen another example of embodiment of a structure S10 schematically represented enabling an adaptation of the force applied to the moveable part of the structure and an amplification of the amplitude of displacement of the actuating beam.

The structure S10 comprises a lever arm 918 articulated in rotation around a Z axis perpendicular to the plane of the structure. Two actuating beams 906 are arranged on one side of the axis of rotation and on either side of the lever and the moveable part 904 is arranged on the other side of the lever arm and the other side of the axis of rotation. The two actuating beams 906 are driven by independent current sources. The current sources may be in phase opposition. The connecting element C forms the articulation in rotation of the lever arm 918.

By designating d1 the distance between the axis of rotation and the point of application of the electrothermal forces Fp on the lever arm and D1 the distance between the axis of rotation and the point of application of the force Fm of the lever arm on the moveable part 904.

$$Fm = d1/D1 \times Fp.$$

It is possible to reduce the intensity of the force applied to the moveable part.

This structure S10 makes it possible to have a displacement applied to the moveable part amplified with respect to that of the actuating beam with a D1/d1 ratio.

In a variant, the axis of rotation of the lever arm may be parallel to the plane of the structure, for example by producing a torsionally deformable axis of rotation.

In FIG. 14, the articulation in rotation of the lever arm comprises two beams R3 forming connecting elements. The stiffness of connections between the movable part and the substrate and between the movable part and the lever arm are represented schematically by springs R1 and R2 respectively. Springs R1 allow a displacement of the movable part along axis Y and the stiffness of springs R2 are high along axis Y to transmit the effort to the mobile part. The stiffness along axis Y of the springs R2 are advantageously at least equal to twice the stiffness along axis Y of springs R1. In addition the angular stiffness around axis Z of springs R2 is similar to the rotation stiffness of the beams R3

The invention claimed is:

1. A microelectromechanical and/or nanoelectromechanical structure with electrothermal actuation comprising:
    a fixed part;
    at least one moveable part with respect to the fixed part;
    at least one first electrothermal actuating beam enabling an electric current to flow from the fixed part to the moveable part;
    at least one second electrothermal actuating beam enabling an electric current to flow from the fixed part to the moveable part;
    at least one electrically conductive connecting element electrically connecting the moveable part to the fixed part;
    a first circuitry for connecting the first electrothermal actuating beam to a first polarisation source; and
    second circuitry for connecting the second electrothermal actuating beam to a second polarisation source, such that the first electrothermal actuating beam and the second electrothermal actuating beam can be polarised differently and separately,
    wherein at least one of said first electrothermal actuating beam and said second electrothermal actuating beam is a nanowire,
    wherein said first electrothermal actuating beam and second electrothermal actuating beam are connected at least mechanically to the moveable part and each are configured to displace the moveable part with respect to the fixed part by an electrothermal force,
    wherein the first electrothermal actuating beam has a longitudinal axis and the second electrothermal actuating beam has a longitudinal axis, the longitudinal axis of the first electrothermal actuating beam and the longitudinal axis of the second electrothermal actuating beam are each aligned and arranged along a same axis on opposite sides of the moveable part so as to be coaxial with each other,
    wherein the first electrothermal actuating beam and the second electrothermal actuating beam apply their respective electrothermal force to the moveable part along the same axis.

2. The structure according to claim 1, wherein the first electrothermal actuating beam and the second electrothermal actuating beam comprise one or more thermoelastic materials configured to deform under the effect of a thermal heating induced by Joule effect by the electric current configured to flow in said beams.

3. The structure according to claim 1, wherein the connecting element has a shape such that an electrothermal force generated within the connecting element does not oppose or opposes little the electrothermal force generated in the first electrothermal actuating beam and the second electrothermal actuating beam.

4. The structure according to claim 1, wherein the connecting element has a crenelated spring shape.

5. The structure according to claim 1, further comprising two connecting elements aligned along an axis perpendicular to an axis with which the first electrothermal actuating beam and the second electrothermal actuating beam are parallel.

6. The structure according to claim 1, wherein a thickness and/or a width of the nanowires is less than or equal to 500 nm.

7. The structure according to claim 1, further comprising at least one first set of a plurality of first electrothermal actuating beams configured to apply simultaneously an electrothermal force of a same direction on the moveable part and a second set of several second electrothermal actuating beams,
    wherein at least one of the first set and the second set are connected respectively to the first and to the second polarisation source, and
    wherein the electrothermal force applied by the first electrothermal actuating beams is opposite to the electrothermal force generated by the second electrothermal actuating beams.

8. The structure according to claim 1, further comprising a rotational articulation between the fixed part and the moveable part and in which the first electrothermal actuating beams and the second electrothermal actuating beams are arranged with respect to the moveable part so as to cause its rotation with respect to the fixed part, said rotation being in the plane of the structure or out-of-plane.

9. The structure according to claim 8, the first electrothermal actuating beams and the second electrothermal actuating beams are aligned and arranged on either side of the moveable part and in which the rotational articulation comprises the two aligned connecting elements defining the axis of rotation, said connecting elements being torsionally deformable and in which the first and second actuating beams are connected mechanically to the moveable part such that the electrothermal forces generated in the actuating beams cause the out-of-plane rotation of the moveable part.

10. The structure according to claim 8, wherein the rotational articulation comprises two connecting elements of which the axes are secant.

11. The structure according to claim 1, wherein the moveable part is mechanically connected to the fixed part by an anchoring, said anchoring forming a connecting element and in which the first electrothermal actuating beams and the second electrothermal actuating beams are oriented with respect to the moveable part to cause its elastic deformation.

12. The structure according to claim 1, wherein the first electrothermal actuating beam and second electrothermal actuating beam have thicknesses less than or equal to half of a thickness of the moveable part and less than or equal to half of a thickness of the connecting element.

13. The structure according to claim 1, wherein the first electrothermal actuating beam and second electrothermal actuating beam have respective widths and thicknesses such that their aspect ratios are comprised between 1 and 2.

14. The structure according to claim 1, further comprising a displacement detector for detecting a displacement of the moveable part.

15. The structure according to claim 14, wherein the displacement detector comprises a piezoresistive detector.

16. The structure according to claim 14, wherein at least one of the first electrothermal actuating beam and second electrothermal actuating beam is used in the displacement detector.

17. A system comprising at least one structure according to claim 1, a first polarisation source and a second polarisation source.

18. The system according to claim 17, wherein the first and second polarisation sources are of direct type and have different amplitudes or are of alternating type and are in quadrature.

19. An actuator comprising at least one system according to claim 17.

20. A sensor comprising at least one system according to claim 17.

21. A method for commanding a system according to claim 17, in which the first electrothermal actuating beam and second electrothermal actuating beam are polarised with different amplitudes or in which the first electrothermal actuating beam and the second electrothermal actuating beam are polarised in quadrature.

22. The method for commanding a system according to claim 21, comprising the steps of:
heating the moveable part to a given temperature and
modulating an amplitude and/or a phase of the polarisations of the first and second polarisation sources such that thermal flux on the first actuating beam tends to increase the given temperature and thermal flux of the second actuating beam tends to reduce the given temperature and such that the temperature of the moveable part is substantially constant.

23. The structure according to claim 1, wherein the actuating beams have thicknesses less than or equal to half of a thickness of the moveable part.

24. The structure according to claim 1, wherein a length of the actuating beams is greater than or equal to at least 10 times a longest transversal dimension of the actuating beams.

25. The structure according to claim 1, wherein a ratio between a length of the actuating beams and a longest transversal dimension of the actuating beams is between 5 and 200.

* * * * *